US010961624B2

(12) United States Patent
Arkles et al.

(10) Patent No.: US 10,961,624 B2
(45) Date of Patent: Mar. 30, 2021

(54) PROCESS FOR PULSED THIN FILM DEPOSITION

(71) Applicants: Gelest Technologies, Inc., Morrisville, PA (US); Alain E. Kaloyeros, Slingerlands, NY (US)

(72) Inventors: Barry C. Arkles, Pipersville, PA (US); Alain E. Kaloyeros, Slingerlands, NY (US)

(73) Assignee: GELEST TECHNOLOGIES, INC., Morrisville, PA (US)

( * ) Notice: Subject to any disclaimer, the term of this patent is extended or adjusted under 35 U.S.C. 154(b) by 0 days.

(21) Appl. No.: 16/738,641

(22) Filed: Jan. 9, 2020

(65) Prior Publication Data

US 2020/0318236 A1    Oct. 8, 2020

Related U.S. Application Data

(60) Provisional application No. 62/828,085, filed on Apr. 2, 2019.

(51) Int. Cl.
| | |
|---|---|
| C23C 16/455 | (2006.01) |
| C23C 16/16 | (2006.01) |
| C23C 16/46 | (2006.01) |
| C23C 16/02 | (2006.01) |

(52) U.S. Cl.
CPC .... *C23C 16/45536* (2013.01); *C23C 16/0245* (2013.01); *C23C 16/16* (2013.01); *C23C 16/45553* (2013.01); *C23C 16/46* (2013.01)

(58) Field of Classification Search
CPC ........ C23C 16/45525; C23C 16/45536; C23C 16/45553; C23C 16/16
See application file for complete search history.

(56) References Cited

U.S. PATENT DOCUMENTS

| | | | |
|---|---|---|---|
| 5,190,792 A | 3/1993 | Blum et al. | |
| 5,451,260 A | 9/1995 | Versteeg et al. | |
| 6,346,477 B1 * | 2/2002 | Kaloyeros | C23C 16/42 438/680 |
| 6,518,168 B1 * | 2/2003 | Clem | B05D 1/283 438/623 |
| 6,524,764 B1 * | 2/2003 | Tomikawa | C08G 73/10 430/191 |
| 6,527,855 B2 * | 3/2003 | DelaRosa | C23C 16/18 117/102 |
| 6,800,134 B2 * | 10/2004 | Dando | C23C 16/452 117/103 |
| 9,981,286 B2 * | 5/2018 | Woodruff | B05D 1/60 |
| 2002/0081381 A1 * | 6/2002 | DelaRosa | C23C 16/18 427/255.28 |
| 2003/0054638 A1 | 3/2003 | Saito et al. | |
| 2006/0019029 A1 * | 1/2006 | Hamer | C23C 16/45544 427/248.1 |
| 2007/0066508 A1 * | 3/2007 | Chen | C11D 11/0047 510/499 |
| 2007/0123060 A1 * | 5/2007 | Rahtu | H01L 21/3141 438/783 |
| 2007/0202254 A1 * | 8/2007 | Ganguli | C23C 16/18 427/252 |
| 2007/0251446 A1 * | 11/2007 | Dahl | C23C 16/02 117/104 |
| 2007/0254488 A1 * | 11/2007 | Huotari | H01L 21/32051 438/720 |
| 2009/0269507 A1 | 10/2009 | Yu et al. | |
| 2010/0093184 A1 * | 4/2010 | Wu | C23C 16/45536 438/765 |
| 2013/0189840 A1 * | 7/2013 | Fu | C23C 16/45523 438/680 |
| 2013/0260555 A1 * | 10/2013 | Zope | H01L 21/76856 438/660 |
| 2014/0256128 A1 | 9/2014 | Spurlin et al. | |
| 2015/0030782 A1 * | 1/2015 | Ivanov | C07D 241/12 427/535 |
| 2015/0079342 A1 * | 3/2015 | Boyd | C01B 32/186 428/141 |
| 2015/0125122 A1 * | 5/2015 | Winarski | G02B 6/25 385/123 |
| 2016/0093485 A1 | 3/2016 | Kobayashi et al. | |
| 2016/0358772 A1 * | 12/2016 | Xie | H01L 21/2807 |
| 2017/0062210 A1 * | 3/2017 | Visser | H01L 21/02304 |

(Continued)

FOREIGN PATENT DOCUMENTS

| | | |
|---|---|---|
| CN | 106611702 A | 5/2017 |
| TW | 201447012 A | 12/2014 |
| WO | WO 2008/013659 A2 * | 1/2008 ........... H01L 21/205 |

OTHER PUBLICATIONS

Vos, Martijn F.J., et al., "Atomic Layer Deposition of Cobalt Using H2, N2, and NH3 Based Plasmas: On the Role of the Co-reactant". J. Phys. Chem. C 2018, 122, 22519-22529.*

Lee, Sungsik, et al., "Subnanometer cobalt oxide clusters as selective low temperature oxidative dehydrogenation catalysts". Nature Communications | (2019) 10:954 | https://doi.org/10.1038/s41467-019-08819-5, pp. 1-9.*

Klesko, Joseph P., et al., "Low Temperature Thermal Atomic Layer Deposition of Cobalt Metal Films". Chemistry of Materials, 2016, 28, 700-703.*

Büyükyazi, Mehtap, et al., "A cobalt(II)heteroarylalkenolate precursor for homogeneous Co3O4 coatings by atomic layer deposition". Dalton Trans., 2017, 46, 12996-13001.*

(Continued)

*Primary Examiner* — Bret P Chen
(74) *Attorney, Agent, or Firm* — Panitch Schwarze Belisario & Nadel LLP

(57) ABSTRACT

A thin film deposition process is provided. The process includes, in a single cycle, providing a precursor in the vapor phase with or without a carrier gas to a reaction zone containing a substrate, such that a monolayer of the precursor is adsorbed to a surface of the substrate and the adsorbed monolayer subsequently undergoes conversion to a discrete atomic or molecular layer of a thin film, without any intervening pulse of or exposure to other chemical species or co-reactants.

27 Claims, 2 Drawing Sheets

(56) References Cited

U.S. PATENT DOCUMENTS

2017/0114451 A1     4/2017   Lecordier
2018/0122687 A1     5/2018   Cooper et al.
2018/0308701 A1*   10/2018   Na .................... C23C 16/45544
2019/0345609 A1*   11/2019   Chen ................ H01L 21/32136

OTHER PUBLICATIONS

Kilic, Ufuk, et al., "Precursor-surface interactions revealed during plasma-enhanced atomic layer deposition of metal oxide thin flms by in-situ spectroscopic ellipsometry". Scientific Reports (2020) 10:10392 pp. 1-12. https://doi.org/10.1038/s41598-020-66409-8.*

Leskela, Markku, et al., "Atomic layer deposition (ALD): from precursors to thin film structures". Thin Solid Films 409 (2002) 138-146.*

Hagen, D.J., et al., "Atomic layer deposition of metals: Precursors and film growth". Applied Physics Reviews 6, 041309 (2019) 1 page. Abstract Only https://doi.org/10.1063/1.5087759.*

International Search Report and Written Opinion dated Jun. 11, 2020 in International Application No. PCT/US2020/024608.

Kaloyeros et al., "Review-Cobalt Thin Films: Trends in Processing Technologies and Emerging Applications," ECS Journal of Solid State Science and Technology, vol. 8, No. 2, pp. P119-P152 (2019).

Office Action dated Sep. 17, 2020 in TW Application No. 109110891 (Partial English Translation).

\* cited by examiner

PROCESS FOR PULSED THIN FILM DEPOSITION

CROSS-REFERENCE TO RELATED APPLICATION

This application claims priority to U.S. Provisional Patent Application No. 62/828,085, filed Apr. 2, 2019, the disclosure of which is herein incorporated by reference in its entirety.

BACKGROUND OF THE INVENTION

This invention relates to methods for pulsed thin film deposition which are novel and original innovations over conventional chemical vapor deposition (CVD), atomic layer deposition (ALD), and other vapor phase deposition techniques, such as molecular layer deposition (MLD) and self-assembled monolayer (SAM) deposition. The pulsed thin film deposition processes according to the present invention minimize the number and complexity of growth cycles, thereby maximizing process efficiency.

As commercial applications across multiple disciplines enter the sub-nanometer scale regime, research and development efforts to identify processing techniques that enable exceptional atomic level control of the composition, uniformity, and morphology of exceedingly thin film structures are intensifying. Historically, the need for tighter control over film uniformity, conformality, and properties at relatively small film thicknesses was met by a gradual evolution from physical vapor deposition (PVD) to CVD, and eventually to ALD. As device design rules approach molecular radius and bond length dimensions, deposition processes with inherent control of atomic order become even more critical. As a rather simplistic example of this criticality, a 2 nm-thick binary film (such as $Al_2O_3$, $Si_3N_4$, and GaAs) will consist of only a 10 to 20 atoms-thick layer, which must be deposited uniformly, continuously, and coherently. A number of terms and descriptors are used for these structures, including ultra-thin films, atomic layers, molecular films, near-zero-thickness layers, and monolayers.

Despite various innovations that improved directional and conformal control, such as high ionization, long-throw chamber geometries, and capacitively-coupled substrate holders for wafer bias, PVD remains a line-of-sight technique in which species impinge on the substrate from the gas phase. Coupled with the challenge of achieving low growth rates consistent with tight control of film thickness, this drawback has limited the applicability of PVD to applications involving thicker films in less aggressive topographies.

In contrast, CVD offers the advantage of surface driven reactions, which can produce enhanced step coverage in minimum ground-rule features. In typical CVD, the gaseous reactants are transported intact to the substrate surface in thermal CVD growth mechanisms. In some cases, the reaction ultimately leading to deposition takes place in the vapor phase. In plasma-assisted CVD (PA-CVD) and plasma-enhanced CVD (PE-CVD) mechanisms, on the other hand, plasma reactions are followed by transport of the resulting transient reactive species to the surface. The reactants are then adsorbed onto the substrate surface, followed by surface diffusion with potential desorption of some reactants, which is in turn followed by surface reaction with film nucleation and growth in island mode, layer-by-layer (step) mode, or a combination of the two. Finally, the resulting volatile reaction byproducts are emitted from the surface. In thermal CVD, higher substrate temperatures allow for longer surface diffusion lengths, leading to extended surface reaction times and resulting in improved step coverage and reduced contaminant incorporation. Pre-adsorption plasma reactions in PA-CVD or PE-CVD, on the other hand, can allow generation of more active reactant species, resulting in higher surface mobility and reaction rates at lower temperatures, as well as shorter surface diffusion lengths, but yielding films with higher contaminant levels and poorer step coverage.

However, CVD film growth proceeds as isolated islands or disconnected layers until a specific thickness is achieved to enable the islands or layers to connect and establish a continuous film. As such, CVD processes are not conducive to the formation of extremely thin coherent layers. Metal-organic chemical vapor deposition (MOCVD), in particular, for depositing cobalt (Co) films is therefore limited to nanoscale device features. An additional challenge in Co MOCVD is tight control of surface reactions to minimize film growth rates in order to precisely control the thickness of extremely thin films.

ALD is categorized by the introduction of the source precursor and co-reactant in sequential (not simultaneous) phases with in-between purge steps to ensure that the co-reactants never cross paths in the reaction zone and that no reactions occur except on the substrate surface. Specifically, referring to FIG. 1A and 1B, typically a substrate is exposed to two reactants AB and XY in a sequential, non-overlapping manner, and each reactant AB, XY reacts with the substrate surface in a self-limited way. As such, reactant AB is first introduced into the reactor to react with the substrate surface. Once all of the reactive sites on the substrate surface have been consumed by the first reactant AB, the growth stops and a purge step is carried out to flush away any remaining reactant molecules. Subsequently, the second reactant XY is inserted into the reactor to react with the reactive sites on the substrate surface and after all of the sites have been consumed by the second reactant XY, another purge step is carried out to flush away any remaining reactant molecules. The alternating reaction/purge steps constitute one cycle by which a single monolayer of the desired thin film is formed. Alternating exposures of the reactants and purge steps are continued in order to complete deposition of the desired thin film.

Using the ALD process, the film growth that proceeds through the self-limiting surface reactions ensure accurate control of film thickness and conformality with atomic level accuracy. These characteristics guarantee the realization of excellent film conformality in extremely aggressive device topographies. The addition of plasma to one of the co-reactants has been shown to enhance the ALD reaction and increase film growth rates due to the creation of a higher concentration of active co-reactant radicals. Furthermore, the use of plasma to perform surface treatment between the various ALD reaction steps leads to higher surface adsorption of source precursor species by maximizing the concentration of active surface sites and decreasing reaction activation energy, leading to lower deposition temperatures.

ALD therefore exhibits a number of attractive features. Further, in addition to enabling excellent conformality in nanoscale device topographies and feature sizes, ALD tends to grow films that are particle and pin-hole free, while providing excellent management of film thickness down to a few atoms. One of the emerging advantages of thermal Co ALD is also its aptitude to enable or prevent area-specific or area-selective film growth, in what is commonly referred to as area-selective ALD. Customized complexes (precursors) and surface assemblies or configurations can be made to react in tightly controlled fashion, so as to catalyze or inhibit deposition on specific areas of the underlying substrate surface, resulting in film formation on only the desired regions of the substrate.

However, current ALD technologies suffer from high surface roughness and very limited growth rates. The latter drawback presents a serious challenge to the incorporation of ALD into real manufacturing protocols, which require a high system throughput to ensure cost effective processes that produce a competitive cost-of-ownership (COO) and a viable return on investment (ROI).

Recently, work has also been reported on the development and application of what is referred to as pulsed CVD. Pulsed CVD is the equivalent of ALD, except that the process is performed at a substrate temperature that leads to partial or complete decomposition of the pulsed precursor upon engagement with the substrate during every exposure cycle, as opposed to being limited to a mere physisorption or chemisorption reaction. A co-reactant is subsequently introduced to complete the decomposition reaction and/or remove the reaction byproducts to ensure a clean film. However, current pulsed CVD technologies suffer from the occurrence of uncontrollable precursor decomposition effects due to partial reaction with the substrate, which introduces undesirable contaminants into the resulting film. They are also plagued by the same issues as ALD, namely, very limited growth rates and thus low manufacturing throughput.

In other words, due to the very low growth rates associated with each ALD or pulsed CVD cycle, an extremely large number of cycles and, as a result, very long deposition times, are required to achieve the target thickness in the final thin film product. In some cases, the deposition process is known to take hours to reach the desired film thickness. This represents a serious challenge to the adoption of ALD or pulsed CVD in real-life manufacturing protocols where process efficiency and productivity are essential.

Therefore, it is desirable to provide a thin film deposition technique that overcomes the above-discussed drawbacks of conventional deposition techniques by minimizing the number and complexity of growth cycles and thereby maximizing process efficiency and productivity.

BRIEF SUMMARY OF THE INVENTION

In one embodiment, the present invention relates to a thin film deposition process comprising, in a single cycle, providing a precursor in the vapor phase with or without a carrier gas to a reaction zone containing a substrate, such that a monolayer of the precursor is adsorbed to a surface of the substrate and the adsorbed monolayer subsequently undergoes conversion to a discrete atomic or molecular layer of a thin film, without any intervening pulse of or exposure to other chemical species or co-reactants.

In another embodiment, the present invention relates to a cobalt-based thin film deposition process comprising: loading a substrate into a reactor; heating the substrate to a temperature in the range of about 75° C.- about 500° C.; and in a single cycle, providing a cobalt precursor in the vapor phase with or without a carrier gas to a reaction zone containing the substrate, such that a monolayer of the cobalt precursor is adsorbed to a surface of the substrate and the adsorbed monolayer subsequently undergoes conversion to a discrete atomic or molecular layer of a cobalt-based thin film, without any intervening pulse of or exposure to other chemical species or co-reactants.

In yet another embodiment, the present invention relates to a thin film deposition process comprising loading a substrate into a reactor; and pulsing a precursor containing at least one metal or metalloid atom and at least one ligand in the vapor phase with or without a carrier gas to a reaction zone containing the substrate to adsorb the precursor onto the substrate, wherein upon adsorption, the precursor dissociates with partial or complete removal of the ligand and a thin film is formed on the substrate.

In yet another embodiment, the present invention relates to a thin film deposition process comprising: loading a substrate into a reactor; providing a first pulse of a precursor in the vapor phase with or without a carrier gas to a reaction zone containing the substrate; forming a remote or direct plasma; alternating between precursor delivery pulses and plasma formation steps to achieve thin film growth on the substrate; shutting off the plasma; and providing a second pulse of the precursor to the reaction zone with or without the carrier gas, such that a monolayer of the precursor is adsorbed to the thin film on the substrate and the adsorbed monolayer undergoes conversion to a discrete atomic or molecular layer of a thin film, without any intervening pulse of or exposure to other chemical species or co-reactants.

DETAILED DESCRIPTION OF THE INVENTION

The present invention relates to methods for pulsed deposition of thin films that offer significant reduction in the time to generate thin films by eliminating a number of the steps required in growth cycles. This invention maximizes process efficiency, leading to viable manufacturing COO and ROI.

The processes of this invention are essentially atomic layer-by-layer pulsed thin film deposition processes. In another sense, the processes of the invention are single cycle ALD or pulsed CVD. According to the methods, a substrate is first loaded into a reaction zone. In one embodiment, the substrate surface may be pretreated ex-situ or in-situ using a chemical, structural and/or plasma pre-treatment to ensure a clean surface with high density of active surface sites and in order to maximize the efficiency, uniformity, and probability of the interactions between precursor species and the substrate surface. Next, the substrate is heated to a predetermined temperature in the range of about 75° C. to about 600° C. The specific temperature of the substrate is dependent upon various factors, such as the type of precursor, the type of substrate, and the desired final film product.

Figure 1A:
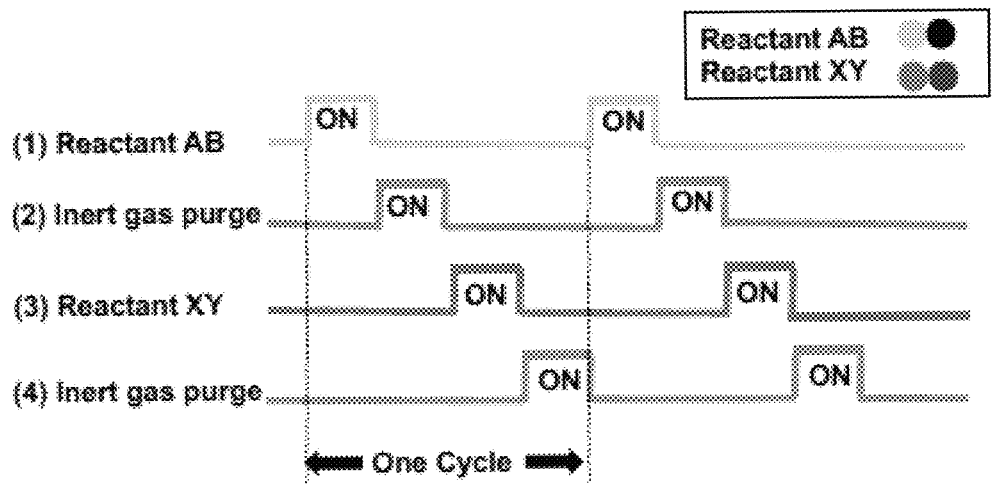
FIG. 1A is graphical representation of a conventional ALD process, which utilizes at least four pulses and two different reactants to form a single monolayer of the desired film.
Figure 1B:
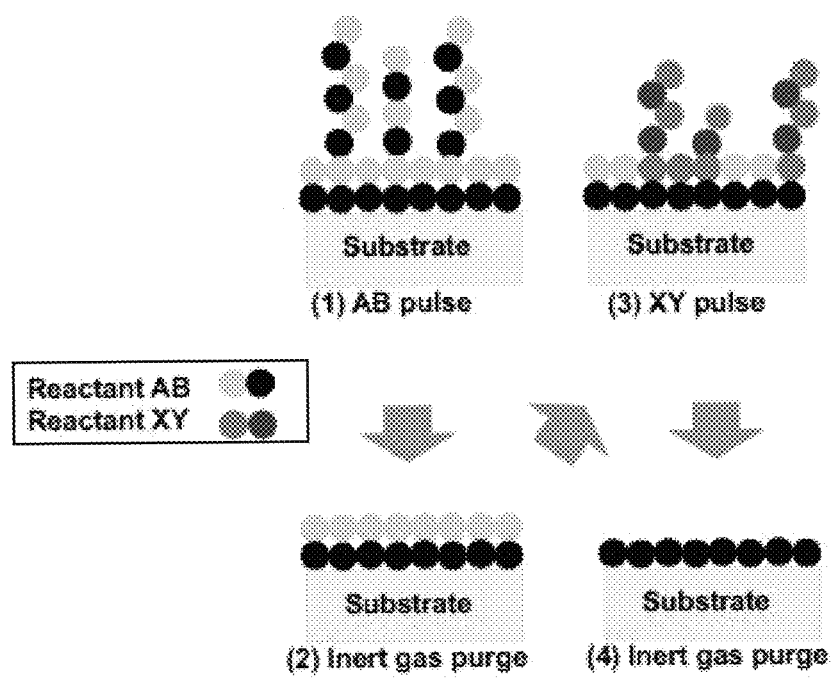
FIG. 1B is a schematic of the conventional ALD process shown in FIG. 1A.
Figure 2A:
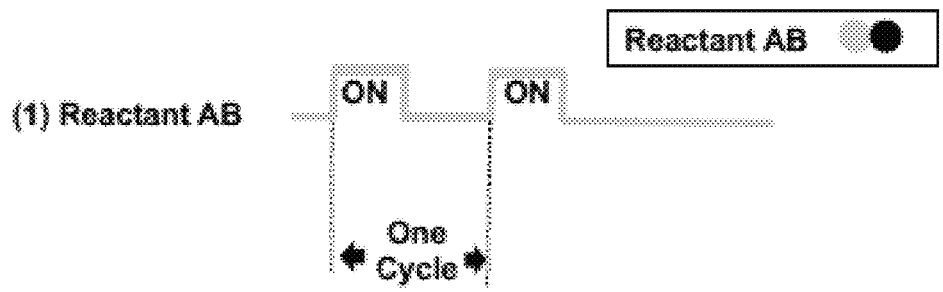
FIG. 2A is a graphical representation of an embodiment of the deposition cycle according to the present invention, which utilizes one pulse of one reactant only with constant carrier gas flow.
Figure 2B:
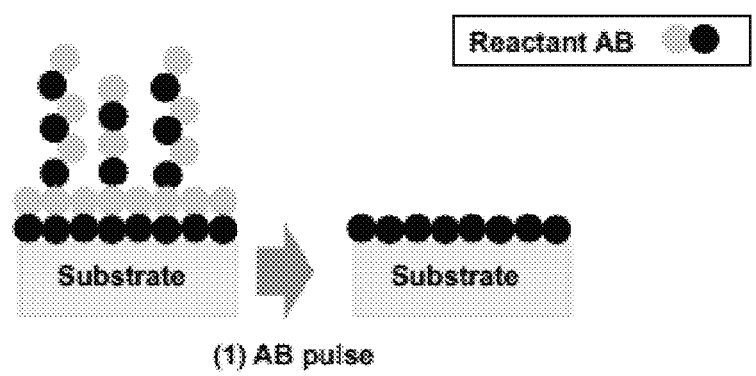
FIG. 2B is a schematic of an embodiment of the deposition cycle according to the present invention shown in FIG. 2A.

After the substrate reaches the predetermined temperature, a single deposition cycle is carried out as follows (see FIG. 2A and 2B). The precursor or reactant AB is pulsed in the vapor phase either alone or in a carrier gas into the reaction zone. The precursor and carrier gas can be pulsed into the reaction zone together or separately from and simultaneously with each other. Upon saturation of the substrate surface with the precursor, a monolayer is formed on the substrate surface by adsorption, and the adsorbed monolayer subsequently undergoes complete conversion to a discrete atomic or molecular layer of the desired composition within this single deposition cycle, without any intervening pulse/exposure or reaction with other chemical species or co-reactants, and without the need for a purge pulse. If the precursor and carrier gas are pulsed together into the reaction zone, the entrainment of the precursor within the pulse is then repeated as many times as required to form a thin film of a desired thickness on the substrate. Alternatively, if the pulse does not contain a carrier gas, then the inclusion of the precursor within a continuous flow can be intermittently reduced as many times as required to form a thin film of desired thickness.

The overall result is a thin film deposition process in which a precursor containing at least one metal or metalloid and at least one ligand is pulsed in the vapor phase with or without carrier gas into a reaction zone containing the substrate and adsorbed onto the substrate under such conditions that, upon adsorption, the precursor dissociates with partial or complete removal of the ligand and a thin film is formed on the substrate. Such dissociation is mediated by the structure, temperature, and chemistry of the substrate surface, the duration of the dissociation reaction with the substrate surface, the precursor partial pressure in the reaction zone, and the vapor phase environment adjacent to the substrate.

The present invention should not be confused with the process disclosed in U.S Pat. No. 5,451,260 of Versteeg. Versteeg discloses pulsed pressure CVD in which the reference to "pulse" is concerned with a delivery method of the precursor to the CVD reactor and not the pulsed thin film deposition processes according to the present invention. The present invention discloses atomic layer-by-layer pulsed thin film deposition processes which minimize the number and complexity of growth cycles through tightly controlled interactions with the substrate, thereby maximizing process efficiency, which is significantly different from pulsed pressure CVD which simply relates to a precursor delivery method to the CVD reactor.

In one embodiment, the conversion of the adsorbed monolayer to a discrete atomic or molecular layer may be aided or enabled by energy transfer provided from an energy source, such as a heated substrate. For example, surface-induced processes, such as energy transfer (thermal exposure) from the substrate, remote or direct plasma application, oxidation, and/or reduction may be used to initiate or facilitate conversion of the adsorbed monolayer to the final deposited film.

One simplified description of an embodiment of the process according to the present invention is to consider an inert gas stream flowing continuously over a substrate. A precursor is pulsed or injected into the inert gas stream in the vapor phase in a sufficient amount under conditions that lead to the formation of an adsorbed monolayer on the substrate. After the pulse ends, the inert gas stream continues to flow over the substrate without the precursor being present. Under appropriate conditions (e.g., conditions of time, temperature, substrate surface pre-treatment, and the like), the adsorbed monolayer undergoes conversion to a film. It will be understood by those skilled in the art that such conditions will depend upon various factors, such as the type of precursor, the type of substrate, the desired final film product, and the like. The process of pulsing or injecting precursor into the inert gas stream is then repeated. Thus, an atomic layer-by-layer deposition proceeds without the intervention of vacuum or a distinct purge cycle. The selection of precursors, precursor concentrations and flow rates, as well as substrate type and conditions, are therefore far more rigorous in the present invention than in conventional ALD.

Preferably, the process functions by saturating the substrate surface with a monolayer of a selected or predetermined precursor that is initially stable as an adsorbed species on the substrate surface or that is stabilized by the type, surface chemistry, pre-deposition preparation and/or pre-treatment of the substrate (e.g., presence of a co-adsorbent on the substrate surface) in a manner that inhibits interaction of the precursor with the substrate surface.

In one embodiment for the deposition of Co-based thin films, examples of preferred precursors may include, but are not limited to, dicobalt hexacarbonyl t-butylacetylene (CCTBA, $Co_2(CO)_6(\eta^2\text{-HC}\equiv\text{Ct-Bu})$), cobalt carbonyl nitrosyl ($Co(CO)_3NO$), dicobalt octacarbonyl, dicocabalt hexacarbonyl trimethylsilylacetylene, dicobalt hexacabonyl bis(trimethylsilyl)acetylene and hydridocobalt carbonyl. In this embodiment, the preferred precursors are preferably kept at temperatures in the range of about 25° C. to about 150° C. in a delivery system, reservoir or bubbler and are introduced into the deposition system with pulses preferably in the range of about 0.1 second to about 20 seconds, more preferably about 1 second to about 20 seconds or about 1 second to about 10 seconds. The substrate is preferably heated to a temperature in the range of about 75° C. to about 500° C.

If the precursor is CCTBA, the substrate is preferably heated to a temperature in the range of about 75° C. to about 300° C. and in a single cycle, the CCTBA precursor is provided as a pulse in the vapor phase with or without a carrier gas to a reaction zone containing the substrate, such that a monolayer of the CCTBA precursor is adsorbed to a surface of the substrate and the adsorbed monolayer subsequently undergoes conversion to a discrete atomic or molecular layer of a cobalt-based thin film, without any intervening pulse of or exposure to other chemical species or co-reactants. If the precursor and carrier gas are pulsed together into the reaction zone, the entrainment of the precursor within the pulse is then repeated as many times as required to form a Co-based thin film of a desired thickness on the substrate. Alternatively, if the pulse does not contain a carrier gas, then the inclusion of the precursor within a continuous flow can be intermittently reduced as many times as required to form a Co-based thin film of desired thickness.

The Co-based thin film may contain Co, Co with O and/or N, cobalt oxide (CoO), cobalt nitride ($Co_2N$ or $Co_4N_2$), or a mixture of these Co phases, alloys, or compounds. In one preferred embodiment, for formation of the adsorbed monolayer, the CCTBA precursor is preferably maintained at a temperature in the range of about 25° C. to about 50° C., the precursor is pulsed into the reactor at pulse durations ranging from about 1 to about 10 seconds and using a carrier gas at a flow rate in the range of about 50 to about 2000 sccm.

If the precursor is $Co(CO)_3NO$, the substrate is preferably heated to a temperature in the range of about 100° C. to about 500° C. and in a single cycle, the $Co(CO)_3NO$ precursor is provided in the vapor phase with or without a carrier gas to a reaction zone containing the substrate, such that a monolayer of the $Co(CO)_3NO$ precursor is adsorbed to a surface of the substrate and the adsorbed monolayer subsequently undergoes conversion to a discrete atomic or molecular layer of a cobalt-based thin film, without any intervening pulse of or exposure to other chemical species or co-reactants. The pulse is then repeated as many times as desired to form a Co-based film of a desired thickness. The Co-based thin film may contain Co, Co with O and/or N, cobalt oxide (CoO), cobalt nitride ($Co_2N$ or $Co_4N_2$), or a mixture of these Co phases, alloys, or compounds.

Other embodiments may include deposition of metals and semiconductors, such as copper (Cu), ruthenium (Ru), tantalum (Ta), titanium (Ti), tungsten (W), and their nitrides, oxides, and carbides, where applicable, as well as dielectric, organic, and insulating films.

In other embodiment for the deposition of Ru-based thin films, examples of preferred precursors may include, but are not limited to, inorganic Ru precursors, such as $RuO_4$, and metal-organic Ru precursors, including ruthenium carbonyls, such as tricarbonyl($\eta^4$-cyclohexa-1,3-diene)ruthenium, $Ru_3(CO)_{12}$, $\eta^4$-2,3-dimethylbutadiene ruthenium tricarbonyl [Ru(DMBD)(CO)$_3$], pentacarbonyl [Ru(CO)$_5$], [Ru(CO)$_3C_6H_8$], Ru(CO)$_2$($\beta$-diketonates)$_2$, [Ru(hfb)(CO)$_4$]$_3$, where hfb=hexafluoro-2-butyne, and triruthenium dodecacarbonyl [Ru$_3$(CO)$_{12}$]; ruthenium diketonates, such as [Ru(acac)$_3$], [Ru(tfa)$_3$], [Ru(tmhd)$_3$]; ruthenium halides, such as Ru(CO)$_2$Cl$_2$, Ru(CO)Br, Ru(CO)$_2$Br, and Ru(CO)$_3$I; and ruthenium alkoxides, alkyls and amidinates. In this embodiment, the preferred precursors are preferably kept at temperatures in the range of about 25° C. to about 150° C. in a delivery system, reservoir or bubbler and are introduced into the deposition system with pulses preferably in the range of about 0.1 second to about 20 seconds, more preferably about 1 to about 20 seconds or about 1 to about 10 seconds.

In these embodiments, the substrate is preferably heated to a temperature in the range of about 100° C. to about 500° C. and in a single cycle, the ruthenium precursor is provided in the vapor phase with or without a carrier gas to a reaction zone containing the substrate, such that a monolayer of the ruthenium precursor is adsorbed to a surface of the substrate and the adsorbed monolayer subsequently undergoes conversion to a discrete atomic or molecular layer of a ruthenium-based thin film, without any intervening pulse of or exposure to other chemical species or co-reactants. The pulse is then repeated as many times as desired to form a Ru-based film of a desired thickness. The Ru-based thin film may contain Ru, Ru with O, ruthenium oxide ($RuO_2$) or a mixture of these Ru phases, alloys, or compounds.

It is within the scope of the invention for the precursors to be introduced into the deposition chamber in the vapor phase with or without an inert carrier gas, such as, for example, helium, argon or nitrogen. The inert carrier gas which is utilized may depend upon the type of film to be formed. Preferably, the inert carrier gas is helium or argon. In other embodiments, the precursors may be introduced into the deposition chamber with a reactive carrier gas, such as, for example, hydrogen, ammonia, carbon monoxide, or a hydrogen-nitrogen mixture. Preferably, the reactive carrier gas is hydrogen or ammonia.

In one embodiment, carrier gas flows are in the range of about 10 to about 2000 sccm. In one embodiment, the number of pulses needed to form a film having a thickness comparable or equal to that achieved by conventional ALD or CVD is preferably in the range of about 50 to about 500 pulses. In another embodiment, the number of pulses required to form a film is one-quarter to one-half of the number of pulses needed to form a film having a thickness comparable or equal to that achieved by conventional ALD or CVD. Preferably, the number of pulses is one-quarter of the number of pulses needed to form a film having a thickness comparable or equal to that achieved by conventional ALD or CVD.

Examples of the material of the substrate include, but are not limited to, silicon (Si), silicon oxide (SiO$_2$), copper (Cu), platinum (Pt), titanium (Ti), titanium nitride (TiN), tantalum (Ta), tantalum nitride (TaN), as well as other insulating, semiconducting, or metallic substrates.

While not wishing to be bound by theory, the monolayer adsorption step is presumably in accordance with the Langmuir adsorption model, which considers generally that the attraction strength between the surface and the first layer of adsorbed substance is much greater than the strength between the first and second layers of adsorbed substances. Specifically, the Langmuir adsorption model presumes that, at isothermal conditions, precursor partial pressure $P_p$ in the reaction zone is related to the precursor volume $V_p$ adsorbed to the substrate. The substrate can be reasonably considered as an ideal solid surface including an array of distinct sites that can bind to the precursor in some form of chemical reaction. The reaction results in an adsorbed precursor complex $A_{ps}$ between the precursor molecule (or a partial precursor molecule) $M_p$ and a substrate surface site S, with a corresponding equilibrium constant $K_{eq}$, as follows:

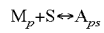

The corresponding Langmuir isotherm is given by the following:

$$\theta_p = \frac{V}{V_m} = \frac{K_{eq}P_p}{1 + K_{eq}P_p}$$

In the invention, there are instances in which the subsequent layers condense under certain combinations of temperature and pressure. It is preferred to avoid these conditions or provide a mechanism for removing less tightly-bound secondary layers of adsorbed species or substances. Such a mechanism comprises, for example, providing an inert gas stream over the substrate or a vacuum condition which allows the desorption of the less tightly-bound secondary layers.

Preferably, the precursor does not undergo an exothermic reaction with the substrate during the adsorption process. Also, preferably, the adsorption of the precursor to form a monolayer is independent from the conversion of the precursor to a thin film. Alternatively stated, the precursor adsorption to the substrate as a monolayer is on a time-scale that can be practically controlled in a manner so that the formation of a monolayer is distinct from the time of conversion of the precursor to a thin film and so that the conversion to a thin film does not require a distinct pulse of a separate reactant.

In one embodiment, the adsorption of the precursor to form a monolayer can be controlled and kept independent from the conversion of the precursor by chemically or structurally engineering the substrate surface to devise an incubation period between the adsorption and conversion steps. In yet another embodiment, the adsorption of the precursor to form a monolayer can be controlled and kept independent from the conversion of the precursor by pre-treating the substrate ex-situ in a chemical solution or in-situ with a plasma pre-treatment. In yet another embodiment, the carrier gas flow can be designed to ensure that the adsorption of the precursor to form a monolayer can be controlled and kept independent from the conversion of the precursor, either alone or in combination with a precisely selected substrate temperature. In yet another embodiment, combinations of two or more of these preferred embodiments can control and keep independent the step of adsorption of the precursor to form a monolayer from the step of conversion of the precursor to form a film layer.

While the precursor may ultimately undergo an exothermic reaction with the substrate, the activation energy for an exothermic reaction is of such a magnitude that the reaction does not take place upon adsorption of the precursor on the substrate surface.

The process according to the invention is different from conventional CVD since, in the present invention, the precursor does not undergo a reaction upon entering the vapor space above the substrate or upon initial adsorption to the substrate. The present invention is also different from conventional ALD because there is a single precursor stream without alternating pulses of co-reactants.

In a preferred embodiment for metallization, the precursor is in oxidation state zero. In a preferred embodiment for dielectric films precursors, the precursor has a low dipole moment in the range of 0 to 2.0 Debye, and preferably in the range of 0 to 1 Debye.

In preferred embodiments, the adsorption is self-limited either inherently or by the presence of a chemical species on the substrate surface that inhibits the decomposition of the precursor by a dissociation process upon adsorption to the substrate. The chemical species is one that can be thought of as entering into an equilibrium process for the dissociation of the precursor. An exemplary precursor for this embodiment is one with readily dissociable ligand(s), such as cobalt carbonyl compounds with carbon monoxide injected into the carrier gas flow stream concomitant with the injection of the cobalt carbonyl compound. When the carbon monoxide is no longer present in the continuous carrier gas flow stream, the absence of the stabilizing effect of the carbon monoxide leads to the conversion of the adsorbed cobalt carbonyl compound to metallic cobalt. In another variation of the process, the cobalt carbonyl compound is pulsed with hydrogen in addition to carbon monoxide. In exemplary embodiments, carbon monoxide or t-butylacetylene may be combined with a CCTBA precursor in the carrier gas stream for formation of the adsorbed monolayer.

The presence of excess ligand(s) drives the equilibrium process toward maintenance of the original precursor structure. In each cycle, following the surface saturation with the precursor, the flow of the carrier gas is continued and dissociation of the ligand(s) from the precursor and/or modification of the substrate surface (e.g., by inhibition or elimination of co-adsorbents) proceed with the removal of any reaction byproducts, such as by diffusion into the carrier gas stream. The removal of byproducts may be achieved by applying vacuum after the initial saturation. However, preferably, operation at a nominally continuous pressure is carried out for removal of byproducts, because vacuum purges would increase cycle time. Such single-cycle pulses are then repeated until the thin film achieves the desired thickness. Depending on the specific substrate and precursor utilized, the same inert gas stream or vacuum can be used both to remove secondary layers of adsorbed precursor and for the removal of byproducts in conjunction with film formation. In the method according to this embodiment, the precursor is preferably in oxidation state 1 or higher.

In another embodiment of the invention, substrate surface saturation with the source precursor is achieved by engineering the precursor pulse in such a manner that the surface saturation (and monolayer formation) is in equilibrium, as long as there is precursor in the vapor phase. In this embodiment, the amount of precursor material required for surface saturation and monolayer formation can be calculated and delivery of the calculated amount of the source precursor into the reaction zone can be accurately controlled through tight management of processing conditions, such as precursor temperature in the precursor reservoir or bubbler, precursor and carrier gas flow rates, and/or pulse time and duration. Alternatively stated, the process according to the invention is a time-controlled, pressure-controlled, and/or temperature-controlled precursor delivery and continuous deposition process.

According to the process of the present invention, film formation proceeds when the adsorbed monolayer (in the absence of vapor phase species that maintain the adsorbate equilibrium) decomposes by dissociation and diffusion of byproducts away from the substrate in each cycle pulse. The single-cycle ALD or pulsed CVD pulses are repeated until a thin film of the desired thickness is achieved.

In exemplary embodiments, the substrate is a silicon substrate which is pretreated with a hydrofluoric acid solution prior to loading of the substrate into the reactor, or the substrate is a copper substrate, which is pretreated by an ex-situ treatment to remove native copper oxide prior to loading of the substrate into the reactor.

In one embodiment, the substrate is pretreated with a plasma treatment process. The plasma treatment process is performed with a remote or direct plasma source using $N_2$, Ar, $NH_3$, $H_2$, $O_2$, or a $H_2+N_2$ mixture plasma at plasma powers ranging from about 100 to about 3000 W. The purpose of the pre-deposition plasma treatment is to further clean the substrate surface and increase the density of reactive substrate surface sites, in order to assist in activating the ALD or pulsed CVD reactions, thereby leading to Co films having minimal or no contamination. A direct plasma treatment may also be used.

In another preferred embodiment, the ALD or pulsed CVD process may be a plasma-enhanced or plasma-assisted process. The plasma-enhanced or plasma-assisted process may be performed with a remote or direct plasma source using $N_2$, Ar, $NH_3$, $H_2$, $O_2$, or a $H_2+N_2$ mixture plasma at plasma powers ranging from about 100 to about 3000 W. The remote or direct plasma may be kept on or shut off during the precursor delivery pulse.

In yet another embodiment, the present invention relates to a thin film deposition process comprising: loading a substrate into a reactor; providing a first pulse of a precursor in the vapor phase with or without a carrier gas to a reaction zone containing the substrate; forming a remote or direct plasma; alternating between precursor delivery pulses and plasma formation steps to achieve thin film growth on the substrate; shutting off the plasma; and providing a second pulse of the precursor to the reaction zone with or without the carrier gas, such that a monolayer of the precursor is adsorbed to the thin film on the substrate and the adsorbed monolayer undergoes conversion to a discrete atomic or molecular layer of a thin film, without any intervening pulse of or exposure to other chemical species or co-reactants.

In another preferred embodiment, in-situ or ex-situ slow or rapid thermal annealing may be carried out on the films after deposition, preferably at temperatures in the range of about 250 to about 1000° C. Annealing may be performed in an atmosphere consisting of $N_2$, Ar, $NH_3$, $H_2$, $O_2$, or a $H_2+N_2$ mixture at pressures ranging from about 1 torr to about 760 torr. The purpose of the post-deposition annealing is to remove any excess ligands or portions of ligands that may have been trapped in the film and yield films with higher density and improved morphology, if needed.

It will be understood by those skilled in the art that the single cycle ALD or pulsed CVD processes described herein can be applied for the formation of unitary, binary, and ternary films consisting of a single- or multi-element compounds and materials with the desired composition and pre-determined thickness. Similar embodiments may also apply for MLD and SAM processes.

The invention will now be described in terms of the following, non-limiting examples.

EXAMPLES

Example 1

A pulsed deposition process was employed for the deposition of Co-based films using the Co(0) source precursor dicobalt hexacarbonyl t-butylacetylene (CCTBA, $Co_2(CO)_6(\eta^2-HC\equiv Ct-Bu)$). A commercial Picosun R-200 Deposition System was employed with various types of semiconductor base substrates including silicon (Si), silicon oxide ($SiO_2$), and copper (Cu). Each substrate was loaded into the reactor either as received or after a predetermined treatment. For example, Si substrates were loaded into the reactor either as received or after treatment with a hydrofluoric acid (HF) solution, resulting in hydrogen- (H—) terminated Si, while Cu substrates were either loaded as is or after ex-situ treatment to remove native copper oxide prior to loading in the reactor. All of the substrates were then heated to a temperature in the range of about 75° C. to about 300° C.

The CCTBA source precursor was maintained at temperatures in the range of about 25° C. to about 50° C. and pulsed into the reactor in the vapor phase at pulse durations ranging from about 1 to about 10 seconds using a carrier gas at flow rates in the range of about 50 to about 2000 sccm. The carrier gas was either $N_2$, Ar, $NH_3$, $H_2$, or a $H_2+N_2$ mixture. After each precursor pulse step (i.e., after saturation of the substrate surface with the source precursor), flow of the carrier gas was continued at flow rates in the range of about 50 to about 2000 sccm and pulse durations ranging from about 1 to about 20 seconds within a continuous flow of carrier gas.

Conversion to a deposited film occurs concomitant with or preferably subsequent to the adsorption of the cobalt precursor. Co-based film deposition was performed for a number of pulses ranging from about 50 to about 500. This is typically one-quarter to one-half of the number of cycles required in conventional ALD to achieve the same film thickness, resulting in a significant reduction in time to produce equivalent films.

It would also be within the scope of the invention to combine carbon monoxide with the CCTBA in the carrier gas stream during the adsorption pulse. Alternatively, t-butylacetylene may be combined with the CCTBA during the adsorption pulse. Both carbon monoxide and t-butylacetylene enter into an equilibrium process with the CCTBA, thereby inhibiting premature dissociation of ligands.

Table 1 below presents a sample of some of the pulsed deposition process experiments performed using CCTBA as source precursor on the commercial Picosun R-200 Deposition System.

TABLE 1

Pulsed deposition process experiments performed using CCTBA as source precursor.

| Substrate | Pre-deposition plasma clean (1 minute) | Cycles | CCTBA Source Temp (°C.) | Pulse (seconds) CCTBA | Pulse (seconds) Co-Reactant | Substrate Temp (°C.) |
|---|---|---|---|---|---|---|
| Native $SiO_2$ HF-treated Si Cu | None | 500 | 25 | 3 | None | 200 |
| Native $SiO_2$ HF-treated Si Cu | $NH_3$ | 500 | 25 | 3 | None | 200 |
| Native $SiO_2$ HF-treated Si Cu | $O_2$ | 500 | 25 | 3 | None | 200 |
| Native $SiO_2$ HF-treated Si Cu | 5% $H_2$ in $N_2$ | 500 | 25 | 3 | None | 200 |
| Native $SiO_2$ HF-treated Si Cu | $NH_3$ | 500 | 25 | 3 | None | 200 |

Example 2

A pulsed deposition process was employed for the deposition of Co-based films using the Co(0) source precursor cobalt tricarbonyl nitrosyl ($Co(CO)_3NO$). A commercial Picosun R-200 Deposition System was employed with various types of semiconductor base substrates including silicon (Si), silicon oxide ($SiO_2$), and copper (Cu). Each substrate was loaded into the reactor either as received or after a predetermined treatment. For example, Si substrates were loaded into the reactor either as received or after treatment with a hydrofluoric acid (HF) solution resulting in hydrogen- (H—) terminated Si, while Cu substrates were either loaded as is or after ex-situ treatment to remove native copper oxide prior to loading in the reactor. All of the substrates were then heated to a temperature in the range of about 75° C. to about 300° C.

The $Co(CO)_3NO$ source precursor was maintained at temperatures in the range of about 18° C. to about 30° C. and pulsed into the reactor in the vapor phase at pulse durations ranging from about 0.1 to about 5 seconds without a carrier gas, followed by a 3.8 seconds $N_2$ purge.

Conversion to a deposited film occurs concomitant with or preferably subsequent to the adsorption of the cobalt precursor. Co-based film deposition was performed for a number of pulses ranging from about 30 to about 500. This is typically one-quarter to one-half of the number of cycles required in conventional ALD to achieve the same film thickness, resulting in a significant reduction in time to produce equivalent films.

It would also be within the scope of the invention to combine carbon monoxide with $Co(CO)_3NO$ during the adsorption pulse. Alternatively, nitric oxide may be combined with the $Co(CO)_3NO$ during the adsorption pulse. Carbon monoxide or nitric oxide enter into an equilibrium process with the $Co(CO)_3NO$, thereby inhibiting premature dissociation of ligands.

Table 2 below presents a sample of some of the pulsed deposition process experiments performed using $Co(CO)_3NO$ as source precursor on the commercial Picosun R-200 Deposition System.

TABLE 2

Pulsed deposition process experiments performed using $Co(CO)_3NO$ as source precursor.

| Substrate | Pre-deposition plasma clean | Cycles | $Co(CO)_3NO$ Source Temp (° C.) | Pulse (seconds) $Co(CO)_3NO$ | Pulse (seconds) $N_2$ Purge | Substrate Temp (° C.) |
|---|---|---|---|---|---|---|
| Native $SiO_2$ HF-treated Si Cu | None | 250 | 18 | 0.1 | 3.9 | 150 |
| Native $SiO_2$ HF-treated Si Cu | None | 250 | 18 | 0.1 | 3.9 | 170 |
| Native $SiO_2$ HF-treated Si Cu | None | 250 | 18 | 0.1 | 3.9 | 190 |

Example 3

A pulsed deposition process was employed for the deposition of Co-based films using the Co(0) source precursor cobalt tricarbonyl nitrosyl ($Co(CO)_3NO$). A commercial ANRIC AT-410 Deposition System was employed with various types of semiconductor base substrates including silicon (Si), silicon oxide ($SiO_2$), and copper (Cu). Each substrate was loaded into the reactor either as received or after a predetermined treatment. For example, Si substrates were loaded into the reactor either as received or after treatment with a hydrofluoric acid (HF) solution resulting in hydrogen- (H—) terminated Si, while Cu substrates were either loaded as is or after ex-situ treatment to remove native copper oxide prior to loading in the reactor. All of the substrates were then heated to a temperature in the range of about 75° C. to about 300° C.

The $Co(CO)_3NO$ source precursor was maintained at temperatures in the range of about 18° C. to about 30° C. and pulsed into the reactor in the vapor phase at pulse durations ranging from about 0.1 to about 5 seconds without a carrier gas, followed by a 4.0 seconds $N_2$ purge.

Conversion to a deposited film occurs concomitant with or preferably subsequent to the adsorption of the cobalt precursor. Co-based film deposition was performed for a number of pulses ranging from about 30 to about 500. This is typically one-quarter to one-half of the number of cycles required in conventional ALD to achieve the same film thickness, resulting in a significant reduction in time to produce equivalent films.

It would also be within the scope of the invention to combine carbon monoxide with $Co(CO)_3NO$ during the adsorption pulse. Alternatively, nitric oxide may be combined with the $Co(CO)_3NO$ during the adsorption pulse. Carbon monoxide or nitric oxide enter into an equilibrium process with the $Co(CO)_3NO$, thereby inhibiting premature dissociation of ligands.

Table 3 below presents a sample of some of the pulsed deposition process experiments performed using $Co(CO)_3NO$ as source precursor on the commercial ANRIC AT-410 Deposition System.

TABLE 3

Pulsed deposition process experiments performed using $Co(CO)_3NO$ as source precursor.

| Substrate | Cu/Si | H/SiO$_2$ | Cu/Si | H/SiO$_2$ | Cu/Si | H/SiO$_2$ | Cu/Si | H/SiO$_2$ | Cu/Si | H/SiO$_2$ |
|---|---|---|---|---|---|---|---|---|---|---|
| Bubbler T (° C.) | room temp | | room temp | | room temp | | room temp | | room temp | |
| Dose Line T (° C.) | 55 | | 55 | | 55 | | 55 | | 55 | |
| Manifold T (° C.) | 60 | | 60 | | 60 | | 60 | | 60 | |
| Chamber T (° C.) | 300 | | 300 | | 250 | | 200 | | 150 | |
| Precursor exposure Time (sec) | 3 | | 3 | | 3 | | 3 | | 3 | |
| # of precursor pulse | 1 | | 1 | | 1 | | 1 | | 1 | |
| Dose fill (sec) | 0.5 | | 0.5 | | 0.5 | | 0.5 | | 0.5 | |
| Dose shut-off delay (sec) | 0.1 | | 0.1 | | 0.1 | | 0.1 | | 0.1 | |
| Dose flow (sec) | 0.25 | | 0.25 | | 0.25 | | 0.25 | | 0.25 | |
| $N_2$ purge gas flow rate (sccm) | 40 sccm | | 40 sccm | | 40 sccm | | 40 sccm | | 40 sccm | |
| Purge (sec) | 3 | | 3 | | 3 | | 3 | | 3 | |
| Co-reactant | None | | None | | None | | None | | None | |
| Cycles | 100 | | 100 | | 100 | | 100 | | 100 | |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for deposition of a thin film onto a substrate, the method comprising, in a single pulse or cycle:
heating a substrate to a temperature of about 75° C. to about 600° C.;
maintaining the substrate at the temperature of about 75° C. to about 600° C.;
providing a precursor in the vapor phase with a carrier gas and/or under vacuum to a reaction zone containing the substrate;
forming a monolayer of the precursor by adsorption to the substrate surface;
wherein the adsorbed monolayer subsequently undergoes conversion to a discrete atomic or molecular layer of a thin film via dissociation and/or decomposition due to or enabled by a substrate surface-induced process and/or interaction with the carrier gas without any intervening or subsequent pulse of or exposure to any other chemical species or co-reactants; and
wherein byproducts of the conversion are removed from the substrate by the carrier gas and/or the vacuum.

2. The method for deposition of a thin film according to claim 1, wherein the single cycle is repeated until a thin film of a predetermined thickness is achieved.

3. The method for deposition of a thin film according to claim 1, wherein the substrate surface-induced process is enabled by an ex-situ and/or in-situ substrate surface chemical, structural, thermal and/or plasma pre-treatment.

4. The method for deposition of a thin film according to claim 1, wherein the substrate surface-induced process is selected from the group consisting of energy transfer, remote plasma application, direct plasma application, oxidation, and reduction.

5. The method for deposition of a thin film according to claim 1, wherein the precursor is selected from the group consisting of dicobalt hexacarbonyl t-butylacetylene,, cobalt carbonyl nitrosyl,, dicobalt octacarbonyl, dicocabalt hexacarbonyl trimethylsilylacetylene, dicobalt hexacarbonyl bis(trimethylsilyl)acetylene, and hydridocobalt carbonyl.

6. The method for deposition of a thin film according to claim 1, wherein the substrate is formed of a material selected from the group consisting of silicon, silicon oxide, copper, platinum, titanium, titanium nitride, tantalum and tantalum nitride.

7. The method for deposition of a thin film according to claim 1, wherein the precursor is selected from the group consisting of copper (Cu), ruthenium (Ru), tantalum (Ta), titanium (Ti), tungsten (W), their nitrides, their oxides, and their carbides.

8. The method for deposition of a thin film according to claim 7, wherein the precursor is a ruthenium precursor, and wherein the thin film deposition process further comprises loading the substrate into a reactor and heating the substrate to a temperature in the range of about 100° C. to about 500° C., such that in the single cycle, the adsorbed monolayer undergoes conversion to a discrete atomic or molecular layer of a ruthenium-based thin film.

9. The method for deposition of a thin film according to claim 1, wherein a metal or metalloid in the precursor is in oxidation state zero.

10. The method for deposition of a thin film according to claim 1, wherein the precursor has a low dipole moment.

11. The method for deposition of a thin film according to claim 1, wherein adsorption of the precursor on the surface of the substrate is self-limited by the presence of a chemical species provided on the surface of the substrate that inhibits decomposition of the adsorbed precursor as enabled by an ex-situ and/or in-situ substrate surface chemical, structural, thermal, and/or plasma pre-treatment.

12. The method for deposition of a thin film according to claim 1, wherein the precursor has at least one readily dissociable ligand.

13. The method for deposition of a thin film according to claim 1, wherein a metal or metalloid in the precursor is in oxidation state 1 or higher.

14. The method for deposition of a thin film according to claim 1, wherein the substrate is pretreated with a plasma treatment process.

15. The method for deposition of a thin film according to claim 1, wherein the process is a plasma-enhanced or plasma-assisted process using a remote or direct plasma source.

16. A method for deposition of a cobalt-based thin film onto a substrate, the method comprising, in a single pulse or cycle:
loading a substrate into a reactor;
heating the substrate to a temperature of about 75° C. to about 500° C.;
maintaining the substrate at a temperature of about 75° C. to about 500° C.;
providing a cobalt precursor in the vapor phase with a carrier gas and/or under vacuum to a reaction zone containing the substrate;
forming a monolayer of the cobalt precursor by adsorption to the substrate surface;
wherein the adsorbed monolayer subsequently undergoes conversion to a discrete atomic or molecular layer of a cobalt-based thin film via dissociation and/or decomposition due to or enabled by a substrate surface-induced process and/or interaction with the carrier gas without any intervening or subsequent pulse of or exposure to any other chemical species or co-reactants; and
wherein byproducts of the conversion are removed from the substrate by the carrier gas and/or the vacuum.

17. The method for deposition of a cobalt-based thin film according to claim 16, wherein the substrate is a silicon substrate, and wherein the silicon substrate is pretreated with a hydrofluoric acid solution prior to loading of the substrate into the reactor.

18. The method for deposition of a cobalt-based thin film according to claim 16, wherein the substrate is a copper substrate, and wherein the copper substrate is pretreated by an ex-situ treatment to remove native copper oxide prior to loading of the substrate into the reactor.

19. The method for deposition of a cobalt-based thin film according to claim 16, wherein, for formation of the adsorbed monolayer, the substrate is heated to a temperature in the range of about 75° C. to about 300° C., the cobalt precursor is a dicobalt hexacarbonyl t-butylacetylene (CCTBA) precursor, the CCTBA precursor is maintained at a temperature in the range of about 25° C. to about 50° C., and wherein the CCTBA precursor is pulsed into the reactor at pulse durations ranging from about 1 second to about 10 seconds and using the carrier gas at a flow rate in the range of about 10 to about 2000 sccm.

20. The method for deposition of a cobalt-based thin film according to claim 19, wherein t-butylacetylene is combined with the CCTBA precursor in a carrier gas stream for formation of the adsorbed monolayer.

21. The method for deposition of a cobalt-based thin film according to claim 16, wherein the carrier gas is selected from the group consisting of $N_2$, Ar, $NH_3$, $H_2$, CO, and a $H_2+N_2$ mixture.

22. The method for deposition of a cobalt-based thin film according to claim 16, wherein during the conversion, a flow of the carrier gas is at flow rates in the range of about 10 to about 2000 sccm and pulse durations ranging from about 1 second to about 20 seconds.

23. The method for deposition of a cobalt-based thin film according to claim 16, further comprising pre-treating the substrate with a plasma either prior or subsequent to heating the substrate.

24. The method for deposition of a cobalt-based thin film according to claim 16, wherein the process is a plasma-enhanced or plasma-assisted process using a remote or direct plasma source.

25. The method for deposition of a cobalt-based thin film according to claim 16, wherein the substrate is heated to a temperature in the range of about 100° C. to about 500° C., and wherein the cobalt precursor is a cobalt tricarbonyl nitrosyl ($Co(CO)_3NO$) precursor.

26. A method for deposition of a thin film onto a substrate, the method comprising in a single pulse or cycle:
loading a substrate into a reaction zone of a reactor;
pulsing a precursor containing at least one metal or metalloid atom and at least one ligand in the vapor phase with a carrier gas and/or under vacuum into the reaction zone containing the substrate; and
forming a monolayer of the precursor by adsorption to the substrate surface,
wherein the adsorbed monolayer subsequently undergoes conversion to a thin film via dissociation due to or enabled by a substrate surface-induced process and/or interaction with the carrier gas without any intervening or subsequent pulse of or exposure to any other chemical species or co-reactants with partial or complete removal of the ligand from the substrate -by the carrier gas and/or the vacuum.

27. A thin film deposition process comprising:
loading a substrate into a reactor;
heating the substrate to a temperature of about 75° C. to about 600° C.;
providing a first pulse of a precursor in the vapor phase with or without a carrier gas to a reaction zone containing the substrate;
forming a monolayer of the precursor by adsorption to the substrate surface;
forming a remote or direct plasma;
wherein the adsorbed monolayer subsequently undergoes conversion to a first discrete atomic or molecular layer of a thin film through a plasma-induced process without any intervening or subsequent pulse of or exposure to any other chemical species or co-reactants;
shutting off the plasma;
providing a second pulse of the precursor to the reaction zone with a carrier gas and/or under vacuum;
forming a second monolayer of the precursor by adsorption to the first discrete atomic or molecular layer of the thin film;
wherein the second adsorbed monolayer subsequently undergoes conversion to a second discrete atomic or molecular layer of a thin film without plasma and without any intervening or subsequent pulse of or exposure to any other chemical species or co-reactants; and
repeating the second pulse until a thin film having a predetermined thickness is achieved.

* * * * *